(12) United States Patent
Kolb et al.

(10) Patent No.: US 6,751,094 B2
(45) Date of Patent: Jun. 15, 2004

(54) COMPUTER SYSTEM COOLING USING TEMPERATURE MONITORING

(75) Inventors: Michael W. Kolb, Austin, TX (US); Jeremey Pionke, Pflugerville, TX (US); Laurent A. Regimbal, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 59 days.

(21) Appl. No.: 10/144,971

(22) Filed: May 14, 2002

(65) Prior Publication Data

US 2003/0214781 A1 Nov. 20, 2003

(51) Int. Cl.[7] .................................................. G06F 1/20
(52) U.S. Cl. .......................... 361/687; 361/697; 439/59; 312/223.2
(58) Field of Search ................................ 361/680–687, 361/679, 724–727, 694–697; 312/223.1–223.6; 439/61–62, 59

(56) References Cited

U.S. PATENT DOCUMENTS

| | | | | |
|---|---|---|---|---|
| 6,411,506 B1 | * | 6/2002 | Hipp et al. | 361/686 |
| 6,459,589 B2 | * | 10/2002 | Manweiler et al. | 361/752 |
| 6,563,706 B1 | * | 5/2003 | Strickler | 361/695 |
| 2003/0105903 A1 | * | 6/2003 | Garnett et al. | 710/300 |

* cited by examiner

*Primary Examiner*—Hung Van Duong
(74) *Attorney, Agent, or Firm*—Haynes and Boone, LLP

(57) ABSTRACT

A method and apparatus for cooling includes a chassis and a midplane mounted in the chassis. More than one airflow opening is formed in the midplane. A temperature measuring sensor is mounted in the chassis. More than one heat generating module is positioned on a first side of the midplane and more than one adjustable airflow generating component is positioned on a second side of the midplane to generate an airflow through each opening. A controller is coupled to determine an output for adjusting each airflow generating component in response to the temperature sensed by each sensor.

20 Claims, 4 Drawing Sheets

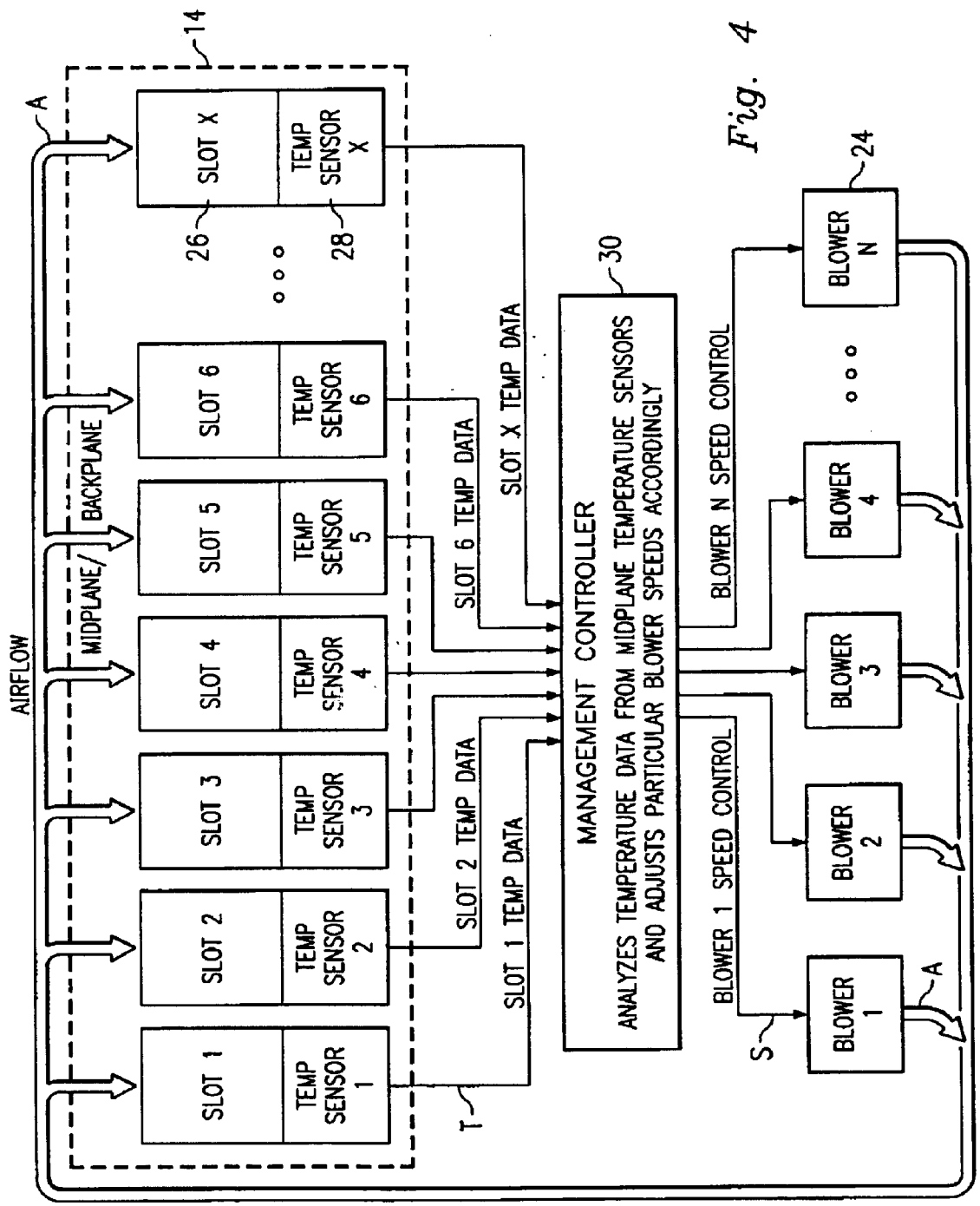

COMPUTER SYSTEM COOLING USING TEMPERATURE MONITORING

BACKGROUND

The disclosures herein relate generally to computer systems and more particularly to cooling a computer with a temperature monitoring apparatus and method.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In modular servers using a midplane, air must be pulled or pushed from one side of the midplane to cool the modules on the other side. Processor core diodes and temperature sensors incorporated on a motherboard can convey local temperature information. Components running hot elsewhere in the server may go unnoticed. Global temperature information is more helpful in determining how much airflow to devote towards each module when multiple fans are used. The problem is to provide a method to interpret global temperature information in a modular server.

Processor core diodes measure the temperature of the processor. Temperature sensors measure the temperature on a specific location on the motherboard. Neither provide global module information.

Hot plug fans, i.e. being able to swap a failed fan while the system is still running, is a very advantageous component to have on a server system. It is always at the top of the "wish list" for service convenience.

Systems have used active heat sinks for years. However, in these cases the fans were always permanently attached to the heat sink. This meant that the heat sink had to be replaced if the fan failed. Replacing a heat sink means shutting down the system, which equates to server down time.

Therefore, what is needed is a computer cooling system that provides intelligent management of airflow within the chassis.

SUMMARY

One embodiment, accordingly, provides a method and apparatus for cooling including a chassis and a midplane mounted in the chassis. More than one airflow opening is formed in the midplane. A temperature measuring sensor is mounted in the chassis. More than one heat generating module is positioned on a first side of the midplane and more than one adjustable airflow generating component is positioned on a second side of the midplane to generate a first airflow through each opening. A controller is coupled to determine an output for adjusting each airflow generating component in response to the temperature sensed by each sensor.

A principal advantage of this embodiment is that the computer system allows for more intelligent and scalable cooling in modular computer chassis, with application in any midplane or backplane structure.

BRIEF DESCRIPTION OF THE DRAWINGS

FIG. 4 is a diagrammatic view illustrating an embodiment of a cooling system.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
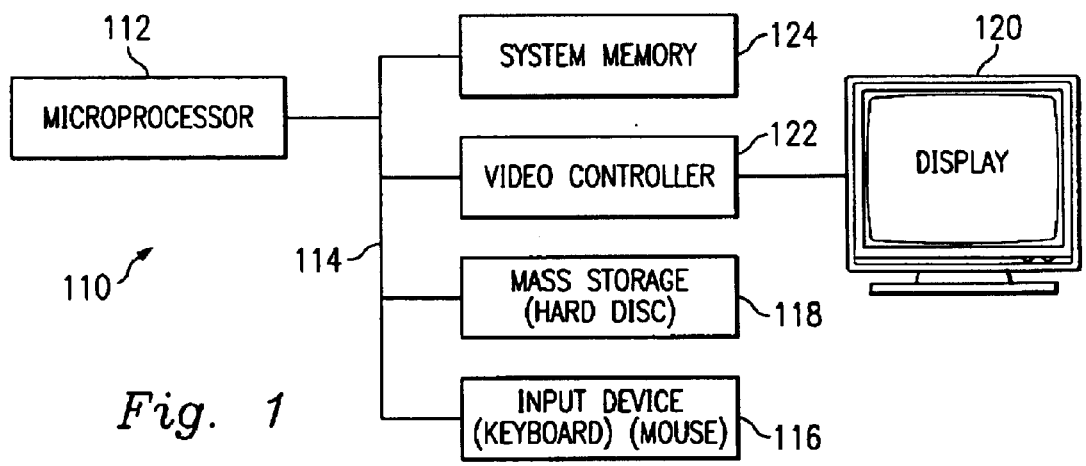
FIG. 1 is a diagrammatic view illustrating an embodiment of a computer system.

In one embodiment, computer system 110, FIG. 1, includes a microprocessor 112, which is connected to a bus 114. Bus 114 serves as a connection between microprocessor 112 and other components of computer system 110. An input device 116 is coupled to microprocessor 112 to provide input to microprocessor 112. Examples of input devices include keyboards, touchscreens, and pointing devices such as mouses, trackballs and trackpads. Programs and data are stored on a is mass storage device 118, which is coupled to microprocessor 112. Mass storage devices include such devices as hard disks, optical disks, magneto-optical drives, floppy drives and the like. Computer system 110 further includes a display 120, which is coupled to microprocessor 112 by a video controller 122. A system memory 124 is coupled to microprocessor 112 to provide the microprocessor with fast storage to facilitate execution of computer programs by microprocessor 112. It should be understood that other busses and intermediate circuits can be deployed between the components described above and microprocessor 112 to facilitate interconnection between the components and the microprocessor.

Figure 2:
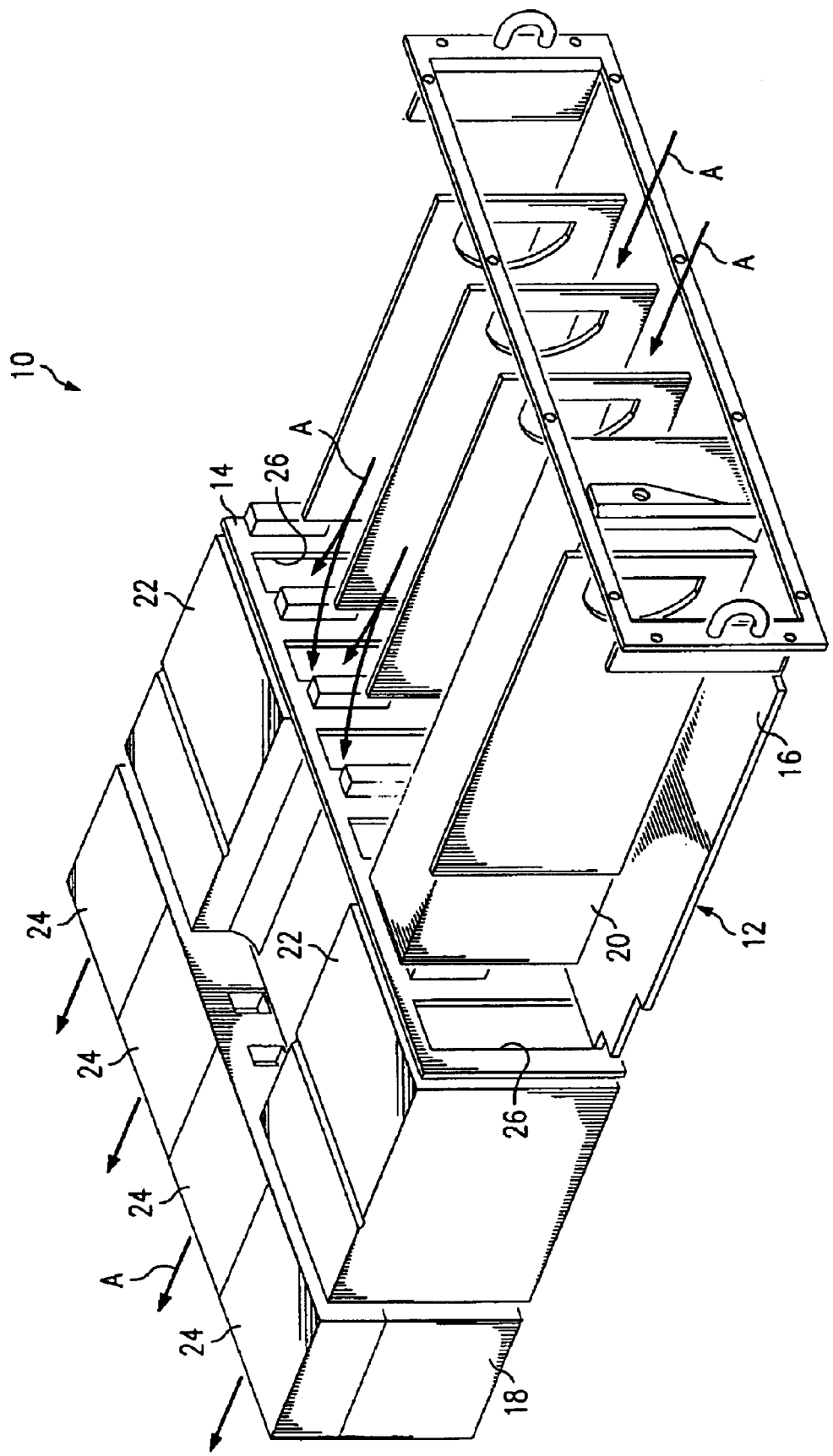
FIG. 2 is a perspective view illustrating an embodiment of a chassis.

An apparatus includes a server 10, FIG. 2, having a chassis 12 which includes a midplane 14 which defines a first side 16 of the chassis 12 and a second side 18 of the chassis 12.

The first side 16 of the chassis 12 includes a plurality of heat generating modules such as server bricks 20, each of which includes a hard drive, a memory, a processor and a heat sink. The second side 18 of the chassis 12 includes a plurality of heat generating components such as power supplies 22 and a plurality of adjustable airflow generating components such as fans 24 or other devices capable of generating a suitable airflow for cooling.

Figure 3:
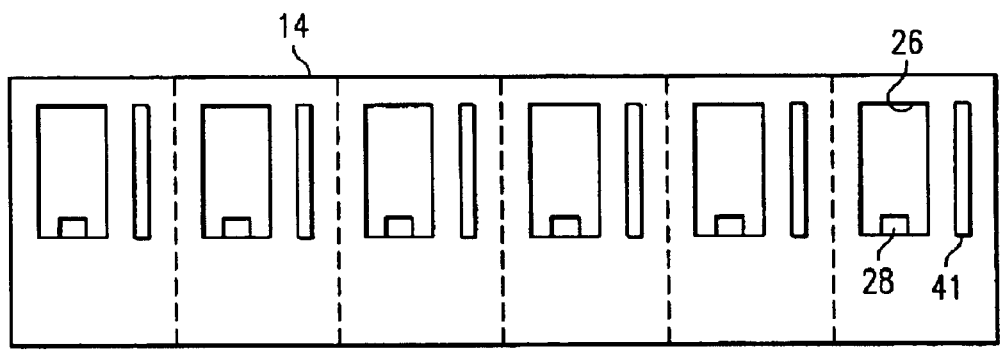
FIG. 3 is a frontal view illustrating an embodiment of a midplane.

The midplane 14, FIG. 3, includes a plurality of airflow openings 26 formed therein and a temperature measuring sensor 28 is optimally mounted adjacent each opening 26. Also, a connector 41 is provided for electrically connecting each server brick 20 to the midplane 14. In this manner, as depicted by airflow arrows A, FIG. 2, operation of the fans 24 draws an airflow from the first side 16, through the openings 26 and across the sensors 28, and into the second side 18 past the power supplies 22. The airflow A then exits the chassis 12 via the fans 24. However, as an alternative, the sensor may be mounted anywhere in the chassis.

Because the heat is not generated evenly in the chassis 12, the cooling in the chassis 12 is not required evenly. Therefore, more than one of the adjustable fans 24 is provided and is individually adjustable by means of a controller 30, FIG. 4 which results in varying the speed and volume of the airflow.

Controller 30 is provided to receive input from each of the sensors 28, read the input and determine an output for each fan 24. This determination may be made based on an algorithm or on data provided in a lookup table. Thus, in FIG. 4 the midplane 14 includes openings 26 and sensors 28 adjacent the openings 26. The airflow A generated by each fan 24 passes through each opening 26 and past each sensor 28. Temperature data input T is provided to the controller 30 and a speed adjusted output S, if required, is provided to each fan 24.

Figure 5:
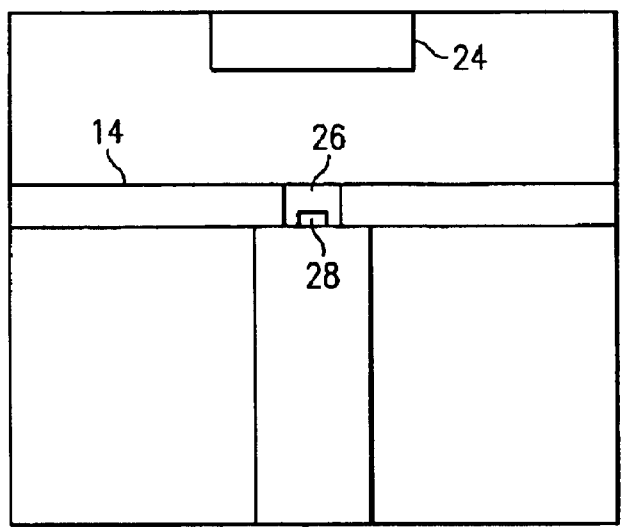
FIG. 5 is a diagrammatic view illustrating an embodiment of a chassis configuration.
Figure 6:
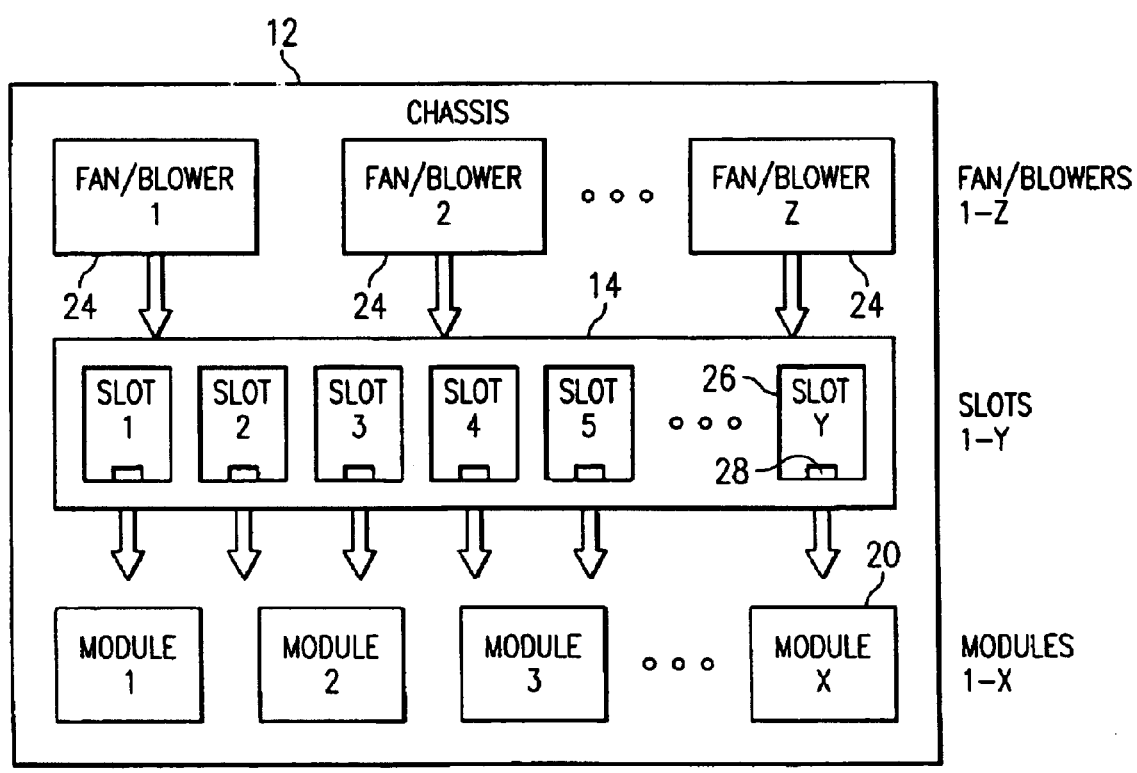
FIG. 6 is a diagrammatic view illustrating an embodiment of another chassis configuration.

Although each heat generating module 20, FIG. 5, may have a dedicated fan 24, opening 26 and sensor 28, i.e., a one-on-one relationship, it is most practical and economical to have a first number of fans 24, i.e. 1 to Z, FIG. 6, a second number of openings 26 and sensors 28, i.e. 1 to Y different than 1 to Z, and a third number of heat generating modules, i.e. 1 to X different than 1 to Y.

In operation, air heated from a module must pass through an opening in the midplane. Mounting a temperature sensor adjacent the rim of each hole will allow the server to monitor the temperature of that air. This measurement provides a global module temperature, as opposed to a local area on the motherboard. This data can be compared to data from a lookup table or an algorithm to determine how hot a module is running. Comparison of this temperature delta versus the delta of other modules in the same system will allow for intelligent management of airflow within the chassis.

This method and apparatus provides a strategic advantage because it allows for more intelligent and scalable cooling in modular computer chassis, with application in any midplane or backplane structure.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. An apparatus for cooling comprising:
   a chassis;
   a midplane mounted in the chassis;
   more than one airflow opening formed in the midplane;
   a temperature measuring sensor mounted;
   more than one heat generating module positioned on a first side of the midplane;
   more than one adjustable airflow generating component positioned on a second side of the midplane to generate airflow through each opening; and
   a controller coupled to receive an input from each sensor, to read the input to determine an output based on a data reference and provide any required airflow adjustment to each airflow generating component.

2. The apparatus as defined in claim 1 wherein the airflow generating component is adjustable for varying the airflow speed.

3. The apparatus as defined in claim 1 wherein the airflow generating component is adjustable for varying the airflow volume.

4. The apparatus as defined in claim 1 wherein the number of heat generating modules is the same as the number of openings and the number of airflow generating components.

5. The apparatus as defined in claim 1 wherein the apparatus includes a first number of heat generating modules, a second number of openings and a third number of airflow generating components, where the first, second and third numbers are not equivalent.

6. The apparatus as defined in claim 1 wherein each airflow generating component is a speed adjustable fan.

7. The apparatus as defined in claim 6 wherein each heat generating module includes a processor and a hard drive.

8. The apparatus as defined in claim 7 further comprising:
   a heat generating component on the second side of the midplane.

9. A computer system comprising:
   a chassis;
   a microprocessor mounted in the chassis;
   an input coupled to provide input to the microprocessor;
   a storage coupled to the microprocessor;
   a video controller coupled to the microprocessor;
   a memory coupled to provide storage to facilitate execution of computer programs by the microprocessor;
   a midplane mounted in the chassis, the midplane including a plurality of openings formed therein;
   a temperature measuring sensor mounted adjacent each opening;
   more than one heat generating module positioned on a first side of the midplane;
   more than one adjustable airflow generating component positioned on a second side of the midplane to generate an airflow through each opening; and
   a controller coupled to receive an input from each sensor, to read the input to determine an output based on a data reference and provide any required airflow adjustment to each airflow generating component.

10. The system as defined in claim 9 wherein the airflow generating component is adjustable for varying the airflow volume.

11. The system as defined in claim 9 wherein the number of heat generating modules is the same as the number of openings and the number of airflow generating components.

12. The system as defined in claim 9 wherein the apparatus includes a first number of heat generating modules, a second number of openings and a third number of airflow generating components, where the first, second and third numbers are not equivalent.

13. The system as defined in claim 9 wherein each airflow generating component is a speed adjustable fan.

14. The system as defined in claim 9 further comprising:
a heat generating component on the second side of the midplane.

15. A method of cooling comprising:
providing a chassis;
mounting a midplane in the chassis;
forming a plurality of airflow openings in the midplane;
mounting a temperature measuring sensor adjacent each airflow opening;
positioning a heat generating module adjacent a first side of the mid plane;
positioning an adjustable airflow generating component on a second side of the midplane to generate an airflow through the opening; and
coupling a controller to receive an input from each sensor, to read the input to determine an output based on a data reference and provide any required airflow adjustment to each airflow generating component.

16. The method as defined in claim 15 wherein the airflow generating component is adjustable for varying the airflow volume.

17. The method as defined in claim 15 wherein a plurality of heat generating modules, openings and airflow generating components are provided in the chassis.

18. The method as defined in claim 15 further comprising:
mounting a heat generating component on the second side of the midplane.

19. The method as defined in claim 17 wherein the apparatus includes a first number of heat generating modules, a second number of openings and a third number of airflow generating components, where the first, second and third numbers are not equivalent.

20. The method as defined in claim 17 wherein each airflow generating component is a speed adjustable fan.

* * * * *

UNITED STATES PATENT AND TRADEMARK OFFICE
CERTIFICATE OF CORRECTION

PATENT NO. : 6,751,094 B2
DATED : June 15, 2004
INVENTOR(S) : Kolb et al.

It is certified that error appears in the above-identified patent and that said Letters Patent is hereby corrected as shown below:

<u>Column 4,</u>
Lines 10 to 23, Claim 1 should read:

1. An apparatus for cooling comprising:
   a chassis;
   a midplane mounted in the chassis;
   more than one airflow opening formed in the midplane;
   a temperature measuring sensor mounted adjacent each opening;
   more than one heat generating module positioned on a first side of the midplane;
   more than one adjustable airflow generating component positioned on a second side of the midplane
to generate airflow through each opening; and
   a controller coupled to receive an input from each sensor, to read the input to determine an output
based on a data reference and provide any required airflow adjustment to each airflow generating
component.

Signed and Sealed this

Twenty-first Day of December, 2004

JON W. DUDAS
*Director of the United States Patent and Trademark Office*